United States Patent
Koyama et al.

(10) Patent No.: US 12,162,257 B2
(45) Date of Patent: Dec. 10, 2024

(54) METAL CLAD LAMINATED PLATE AND METHOD FOR MANUFACTURING METAL CLAD LAMINATED PLATE

(71) Applicant: PANASONIC INTELLECTUAL PROPERTY MANAGEMENT CO., LTD., Osaka (JP)

(72) Inventors: Masaya Koyama, Mie (JP); Yusuke Ito, Mie (JP); Yoshinori Matsuzaki, Mie (JP); Kiyotaka Komori, Hyogo (JP); Hiroaki Takahashi, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/150,008

(22) Filed: Jan. 4, 2023

(65) Prior Publication Data

US 2023/0145377 A1   May 11, 2023

Related U.S. Application Data

(62) Division of application No. 17/289,582, filed as application No. PCT/JP2019/042051 on Oct. 25, 2019, now abandoned.

(30) Foreign Application Priority Data

Oct. 29, 2018   (JP) .................. 2018-203324

(51) Int. Cl.
*B32B 37/06* (2006.01)
*B32B 3/26* (2006.01)
(Continued)

(52) U.S. Cl.
CPC .............. *B32B 37/06* (2013.01); *B32B 3/26* (2013.01); *B32B 3/30* (2013.01); *B32B 15/08* (2013.01);
(Continued)

(58) Field of Classification Search
CPC ............ B32B 2457/08; B32B 2305/55; B32B 37/06; B32B 37/1027; B29C 66/83423;
(Continued)

(56) References Cited

U.S. PATENT DOCUMENTS

| | | |
|---|---|---|
| 2017/0318670 A1 | 11/2017 | Tachibana et al. |
| 2018/0134025 A1 | 5/2018 | Nakashima |
| 2020/0114623 A1 | 4/2020 | Takahashi et al. |
| 2020/0290315 A1 | 9/2020 | Hiramatsu |

FOREIGN PATENT DOCUMENTS

| | | | |
|---|---|---|---|
| EP | 697278 A1 * | 2/1996 | ............. B32B 15/08 |
| JP | 2010-221694 | 10/2010 | |

(Continued)

OTHER PUBLICATIONS

Fukuchi et al., "Approach to the Low Transmission Loss from the Copper Foil", Journal of the Japan Institute of Electronics Packaging, vol. 18, 170.5, 2015, pp. 319-323, along with partial Englihs translation.

Official Communication issued in International Patent Application No. PCT/JP2019/042051, dated Jan. 21, 2020, along with an English translation thereof.

Korean Office Action issued in KR Application No. 10-2021-7012675, dated Mar. 21, 2024.

(Continued)

*Primary Examiner* — John L Goff, II
(74) *Attorney, Agent, or Firm* — GREENBLUM & BERNSTEIN, P.L.C.

(57) ABSTRACT

A method for manufacturing a metal clad laminated plate includes hot pressing a laminated body by a double belt press method. The laminated body includes an insulating film containing the liquid crystal polymer and the metal foil lying on the insulating film. In hot pressing the laminated body, a highest heating temperature is higher than or equal to a temperature lower than a melting point of the insulating film by 5° C. and lower than or equal to a temperature higher than the melting point by 20° C. The highest heating temperature is maintained for longer than or equal to 20 seconds and shorter than or equal to 120 seconds.

16 Claims, 6 Drawing Sheets

(51) Int. Cl.
   *B32B 3/30*   (2006.01)
   *B32B 15/08*  (2006.01)
   *B32B 37/10*  (2006.01)
   *H05K 1/05*   (2006.01)

(52) U.S. Cl.
   CPC ........... *B32B 37/1027* (2013.01); *H05K 1/05* (2013.01); *B32B 2250/03* (2013.01); *B32B 2250/40* (2013.01); *B32B 2305/55* (2013.01); *B32B 2307/206* (2013.01); *B32B 2307/538* (2013.01); *B32B 2307/734* (2013.01); *B32B 2307/748* (2013.01); *B32B 2457/08* (2013.01)

(58) Field of Classification Search
   CPC ..................... H05K 3/38; H05K 3/382; H05K 2201/0141; H05K 1/05
   See application file for complete search history.

(56) References Cited

FOREIGN PATENT DOCUMENTS

| | | |
|---|---|---|
| JP | 2011-230308 | 11/2011 |
| JP | 2016-172275 | 9/2016 |
| WO | 2016/114262 | 7/2016 |
| WO | 2016/170779 | 10/2016 |
| WO | 2017/051897 | 3/2017 |
| WO | 2017/150678 | 9/2017 |
| WO | 2018/221500 | 12/2018 |

OTHER PUBLICATIONS

Notice of Information Provision issued in Korean patent application No. 10-2021-7012675, dated Feb. 20, 2024.

\* cited by examiner

METAL CLAD LAMINATED PLATE AND METHOD FOR MANUFACTURING METAL CLAD LAMINATED PLATE

CROSS-REFERENCE TO RELATED APPLICATIONS

This application is a Divisional of U.S. patent application Ser. No. 17/289,582, filed Apr. 28, 2021, which is a National Stage Entry of International Patent Application No. PCT/JP2019/042051, filed Oct. 25, 2019, which claims the benefit of Japanese Patent Application No. 2018-203324, filed Oct. 29, 2018. The disclosure of each of the applications listed above is incorporated by reference herein in its entirety.

TECHNICAL FIELD

The present disclosure relates to a metal clad laminated plate and a method for manufacturing the metal clad laminated plate.

BACKGROUND ART

Patent Literature 1 discloses a laminate (a metal clad laminated plate) for a flexible printed wiring board. The metal clad laminated plate is manufactured by hot press molding of an insulating film and a metal foil stacked on one another. Thus, the insulating film is welded to the metal foil, and therefore, an insulating layer including the insulating film is in close contact with the metal foil.

The laminate disclosed in Patent Literature 1, however, often requires an increased heating temperature, an increased welding pressure, or the like when the metal foil is welded to the insulating film in order to increase adhesive strength between the insulating layer and the metal foil (the pull strength of the metal foil from the insulating layer). Therefore, the metal clad laminated plate, which is an end product, may difficultly have a preferred plate thickness accuracy.

CITATION LIST

Patent Literature

Patent Literature 1: JP 2010-221694 A

SUMMARY OF INVENTION

It is an object of the present disclosure to provide a metal clad laminated plate having a preferred plate thickness accuracy and preferred pull strength and a method for manufacturing the metal clad laminated plate.

An aspect of the present disclosure is a metal clad laminated plate including: an insulating layer containing a liquid crystal polymer; and a metal foil lying on the insulating layer. The metal foil has a surface lying on the insulating layer. The surface has a mean width of profile elements (RSm) of greater than or equal to 10 μm and less than or equal to 65 μm. The mean width is calculated from a roughness curve obtained from a cross section of the metal clad laminated plate. The metal clad laminated plate has a plate thickness accuracy of less than ±20%. Pull strength of the metal foil from the insulating layer is greater than or equal to 0.8 N/mm.

A method for manufacturing a metal clad laminated plate of an aspect of the present disclosure is a method for manufacturing the metal clad laminated plate. The method includes hot pressing a laminated body by a double belt press method. The laminated body includes the insulating film containing the liquid crystal polymer and the metal foil on the insulating film.

The present disclosure provides a metal clad laminated plate having a preferred plate thickness accuracy and preferred pull strength.

DESCRIPTION OF EMBODIMENTS

An embodiment of the present disclosure will be described below.

<Metal Clad Laminated Plate>

First, a metal clad laminated plate 1 according to an embodiment will be described with reference to FIGS. 1 to 4.

Figure 1:
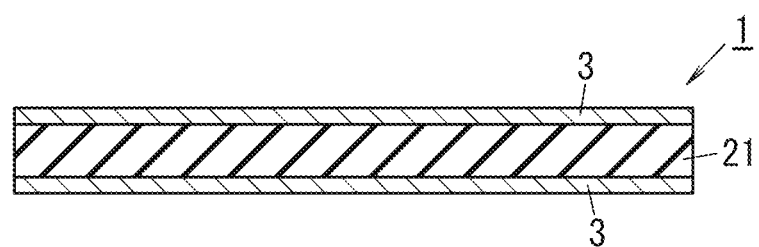
FIG. 1 is sectional view schematically illustrating an example of a metal clad laminated plate according to an embodiment.

As illustrated in FIG. 1, the metal clad laminated plate 1 includes an insulating layer 21 and metal foils 3. The insulating layer 21 contains a liquid crystal polymer. The metal foils 3 lie on the insulating layer 21. The pull strength of each metal foil 3 from the insulating layer 21 is greater than or equal to 0.8 N/mm, and the metal clad laminated plate 1 has a plate thickness accuracy of less than ±20%.

Saying that the plate thickness accuracy is less than ±20% specifically means that a maximum thickness is less than T×1.20 and a minimum thickness is greater than T×0.8, where T is the average thickness of the metal clad laminated plate 1. Thus, the metal clad laminated plate 1 can have a uniform thickness, and a printed wiring board formed of the metal clad laminated plate 1 can have preferred high-frequency transmission characteristics. The plate thickness accuracy of the metal clad laminated plate 1 is preferably less than or equal to ±10%, that is, the maximum thickness is less than T×1.10 and the minimum thickness is greater than T×0.9.

The maximum thickness and the minimum thickness of the metal clad laminated plate 1 are obtained by, for example, the following method. First, thicknesses of the metal clad laminated plate 1 are measured at arbitrary ten points of the metal clad laminated plate 1. Then, a maximum value and a minimum value of the thicknesses at the ten points are respectively defined as the maximum thickness and the minimum thickness. Further, an average value is calculated from the thicknesses at the ten points, thereby obtaining the average thickness of the metal clad laminated plate 1. The average thickness of the metal clad laminated plate 1 is preferably, greater than or equal to 25 μm and less than or equal to 300 μm.

Moreover, each metal foil 3 has a surface which lies on the insulating layer 21 and which has a mean width of profile elements (RSm) of greater than or equal to 10 µm and less than or equal to 65 µm. The mean width of the profile elements (RSm) is derived from a shape of a surface, in contact with the insulating layer 21, of the metal foil 3, the surface appearing in a cross section of the metal clad laminated plate 1. This cross section is parallel to a direction in which the metal foil 3 lies on the insulating layer 21, and the cross section has a length of 10 µm in a direction orthogonal to the direction in which the metal foil 3 lies on the insulating layer 21.

Figure 2:
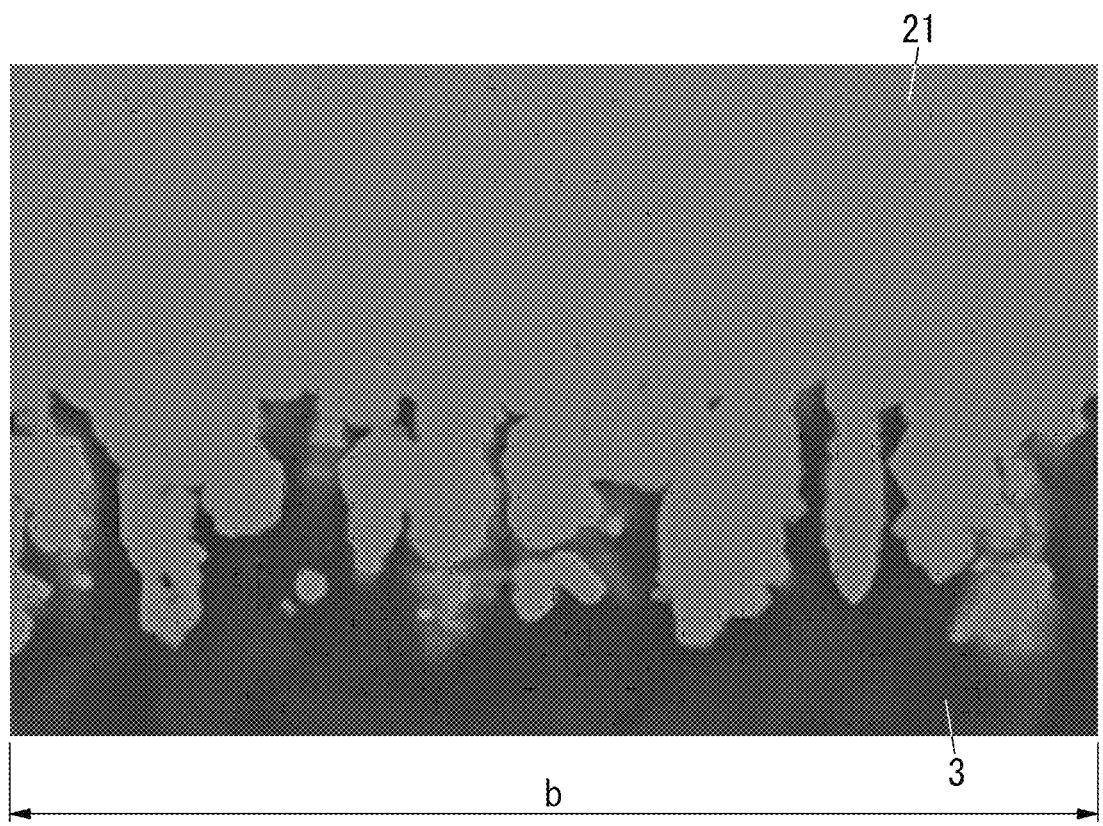
FIG. 2 is a photograph of a cross section of part of the metal clad laminated plate according to the embodiment.
Figure 3:
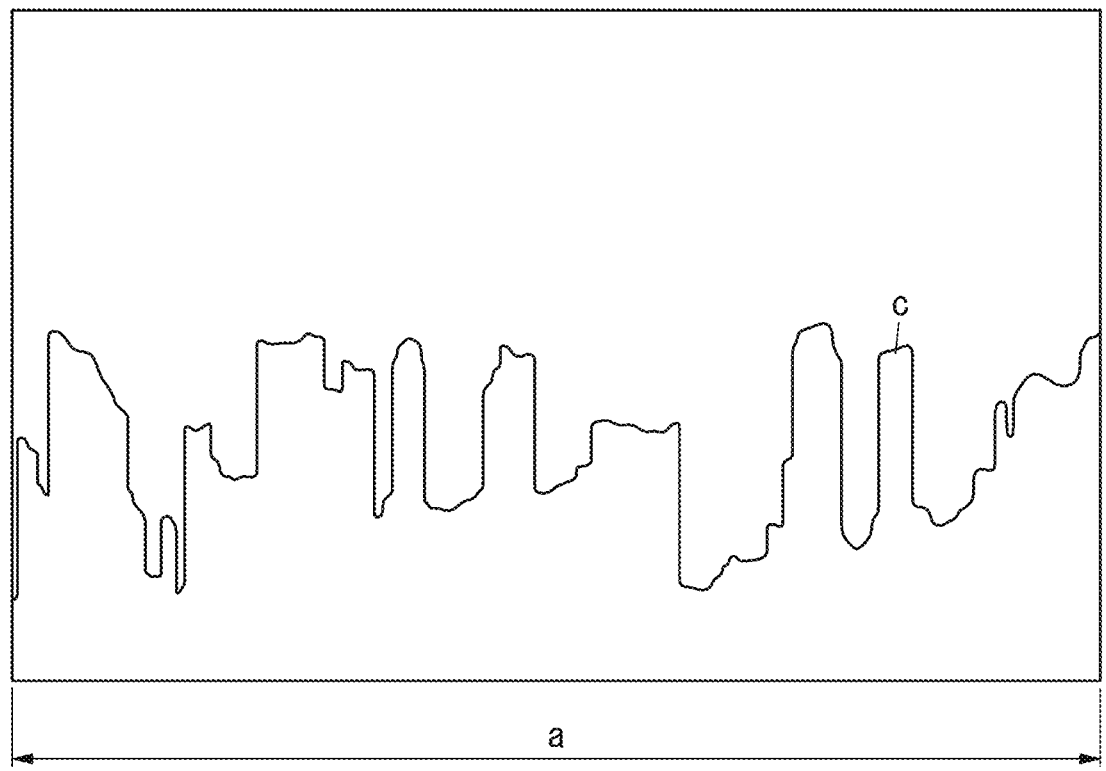
FIG. 3 is a view illustrating the metal clad laminated plate according to the embodiment.

Specifically, an image of the cross section of the metal clad laminated plate 1 as illustrated in FIG. 2 is captured at first, where the cross section has a length b of 10 µm. From the shape, which appears in the cross section and which is the shape of the surface, which is in contact with the insulating layer 21, of the metal foil 3, a roughness curve c as illustrated in FIG. 3 is obtained. The roughness curve c is a projection line that appears in the cross section when in the cross section of FIG. 2, for example, vertically projecting a virtual straight line toward the surface, which is in contact with the insulating layer 21 in the cross section, of the metal foil 3. The virtual straight line is parallel to a direction orthogonal to a direction in which the metal foil 3 and the insulating layer 21 face each other. The virtual straight line extends along the cross section. The mean width of profile elements (RSm) is calculated from the roughness curve c in accordance with Japanese Industrial Standards (JIS) B 0601: 2001. Note that the length a sown in FIG. 3 is 10 82 m similarly to the length b of FIG. 2.

The mean width of the profile elements (RSm) of greater than or equal to 10 µm makes easy engagement of the insulating layer 21 and the metal foil 3 with each other. This can increase the adhesiveness (pull strength) between the insulating layer 21 and the metal foil 3. Moreover, the mean width of profile elements (RSm) of less than or equal to 65 82 m makes voids less likely to be formed between the insulating layer 21 and the metal foil 3. Thus, impairment of the adhesiveness due to the voids is hardly caused, and the metal clad laminated plate 1 easily obtains a preferred plate thickness accuracy. In addition, the mean width of profile elements (RSm) of greater than or equal to 10 µm and less than or equal to 65 µm easily imparts preferred high-frequency transmission characteristics to the printed wiring board formed of the metal clad laminated plate 1.

In the metal clad laminated plate 1 according to the present embodiment, a ten-point average roughness (Rzjis) calculated from the roughness curve c as illustrated in FIG. 3 is preferably greater than or equal to 0.5 µm and less than or equal to 3 82 m. This makes easier the engagement of the insulating layer 21 and the metal foil 3 with each other and further reduces voids formed between the insulating layer 21 and the metal foil 3. This can increase the adhesiveness (pull strength) between the insulating layer 21 and the metal foil 3. The ten-point average roughness (Rzjis) is calculated in accordance with JIS B 0601:2001.

Moreover, in the metal clad laminated plate 1, an improved dimensional stability is obtained. The dimensional stability is calculated in accordance with IPC-TM650 No. 2.2.4 Method C. The dimensional stability thus obtained is preferably less than or equal to ±0.1%. Such an improved dimensional stability results from reduced interior stress in the insulating layer 21. Thus, when a printed wiring board (referred to as a first wiring plate) formed of the metal clad laminated plate 1 is laminated with another printed wiring board (referred to as a second wiring plate) including an insulating layer and a conductor wire to provide a multilayer printed wiring board, a conductor wire on the first wiring plate and the conductor wire on the second wiring plate are less likely to be shifted from each other. Thus, when a through hole through which the conductor wires are to be connected is formed in the multilayer printed wiring board, the through hole is also less likely to be positionally shifted from each of the conductor wires.

In the present embodiment, the metal foil 3 is at least a metal film applicable to the metal clad laminated plate 1. The metal foil 3 is, for example, a copper foil. Moreover, the metal foil 3 has a thickness of, for example, greater than or equal to 6 82 m and less than or equal to 70 µm.

When the metal foil 3 is a copper foil, examples of the copper foil include an electrolytic copper foil and a rolled copper foil.

Moreover, the insulating layer 21 contains a liquid crystal polymer as described above. The liquid crystal polymer preferably has a melting point of higher than or equal to 300° C. and lower than or equal to 345° C. The melting point of the liquid crystal polymer is obtained by measuring the melting point of an insulating film 2 which will be described later by, for example, differential scanning calorimetry (DSC).

Examples of the liquid crystal polymer includes: a polyarylate-based liquid crystal polymer; a copolymer including wholly aromatic polyester, semi-rigidity aromatic polyester, polyester amide, aromatic, or aliphatic dihydroxy compound as a raw material; a copolymer including aromatic or aliphatic dicarboxylic acid as a raw material; a copolymer including aromatic hydroxy carboxylic acid as a raw material; a copolymer including aromatic diamine as a raw material; and a copolymer including aromatic hydroxy amine or aromatic amino carboxylic acid as a raw material. The liquid crystal polymer contains at least one of the compounds described above.

The insulating layer 21 may further contain an additive such as a filler. Alternatively, the insulating layer 21 may contain only the liquid crystal polymer.

Figure 4:
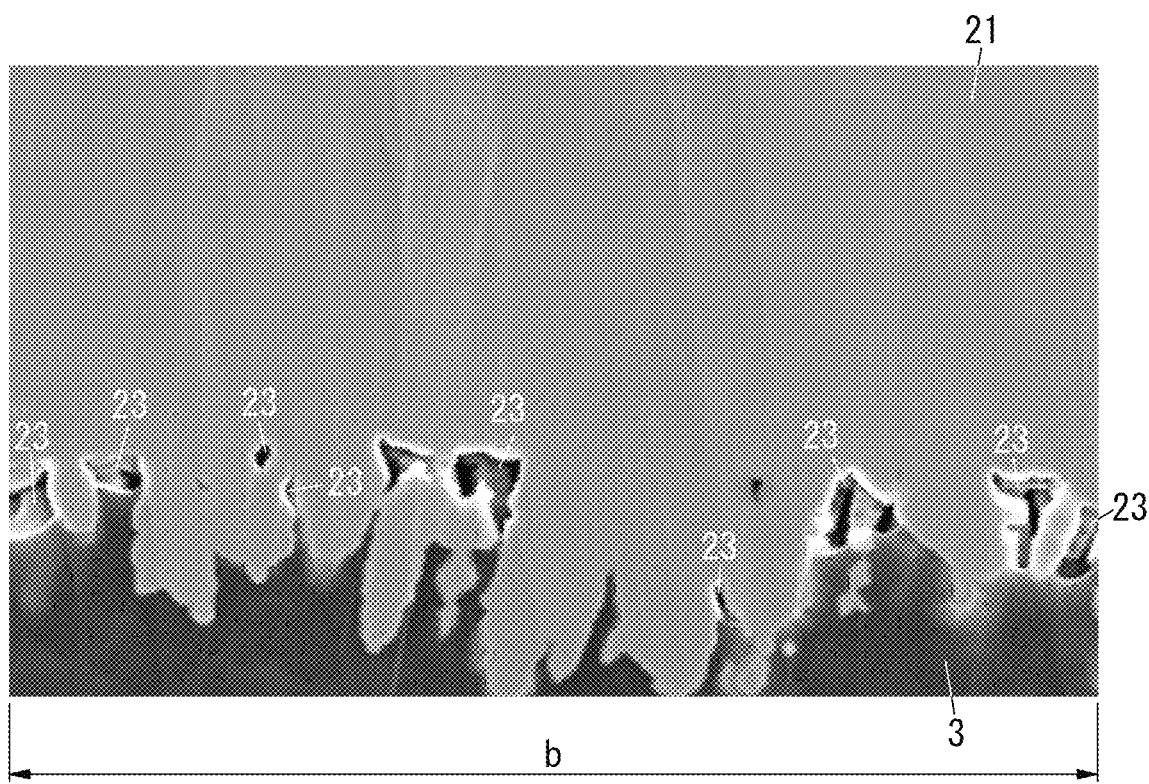
FIG. 4 is a photograph of a cross section of part of a metal clad laminated plate of a second comparative example.

Moreover, in the metal clad laminated plate 1 according to the present embodiment, the number of voids which exist between the metal foil 3 and the insulating layer 21 and appear in the cross section as shown in FIG. 2 is preferably three or less per 10 µm in length in the direction orthogonal to a direction in which the metal foil 3 and the insulating layer 21 face each other. In this case, engagement of the insulating layer 21 and the metal foil 3 to each other is improved, which can improve the adhesiveness (pull strength) between the insulating layer 21 and the metal foil 3. The number of voids appearing between the insulating layer 21 and the metal foil 3 is preferably as small as possible and is particularly preferably zero. Note that the voids are voids 23 at the border between the insulating layer 21 and the metal foil 3 as shown in FIG. 4.

The metal clad laminated plate 1 according to the present embodiment is manufactured by, for example, a double belt press method.

<Method for Manufacturing Metal Clad Laminated Plate>

Next, a manufacturing method of the metal clad laminated plate 1 according to the embodiment will be described with reference to FIGS. 5 and 6.

The manufacturing method is a method for manufacturing the metal clad laminated plate 1. Thus, the present embodiment may make reference to the description of the metal clad laminated plate 1.

The manufacturing method includes a preparation step and a molding step.

The preparation step is a step of preparing the insulating film 2 and the metal foils 3. Each metal foil 3 has a surface (hereinafter referred to as a contact surface) to be laid on the insulating film 2, and the ten-point average roughness (Rzjis), which is defined in JIS B 0601:2001, of the contact surface is preferably greater than or equal to 0.5 μm and less than or equal to 3 Adopting the metal foil 3 whose contact surface having such a ten-point average roughness (Rzjis) in manufacturing of the metal clad laminated plate 1 provides ten-point average roughness (Rzjis) calculated from the roughness curve c as illustrated in FIG. 3. The roughness curve c is obtained from the shape of the surface, which is in contact with the insulating layer 21 in the cross section of the metal clad laminated plate 1, of the metal foil 3. Moreover, the ten-point average roughness (Rzjis) may be greater than or equal to 1.0 82 m and less than or equal to 2.5 μm.

The mean width of profile elements (RSm), which is defined in JIS B 0601:2001, of the contact surface is preferably greater than or equal to 10 μm and less than or equal to 65 μm, and more preferably greater than or equal to 20 μm and less than or equal to 65 μm. Adopting the metal foil 3 whose contact surface having such a mean width of profile elements (RSm) in manufacturing of the metal clad laminated plate 1 provides a mean width of profile elements (RSm), the mean width being calculated from the roughness curve c as illustrated in FIG. 3. The roughness curve c is obtained from the shape of the surface, which is in contact with the insulating layer 21 in the cross section of the metal clad laminated plate 1, of the metal foil 3.

The roughness of the contact surface is adjusted by subjecting the surface of the metal foil 3 to, for example, an appropriate roughening process. Moreover, when the metal foil 3 is an electrolytic copper foil, the electrolytic copper foil has a matte surface formed when the electrolytic copper foil is manufactured. The matte surface may be processed to have the above-described roughness, and the matte surface thus processed may be used as the contact surface.

The insulating film 2 contains a liquid crystal polymer. Such an insulating film 2 preferably has a melting point of higher than or equal to 300° C. and lower than or equal to 345° C. The melting point of the insulating film 2 can be obtained by being measured by, for example, differential scanning calorimetry (DSC). Moreover, the thickness of the insulating film 2 is arbitrarily selected and is, for example, greater than or equal to 12.5 μm and less than or equal to 200 μm.

The insulating film 2 may further contain an additive such as a filler. Alternatively, the insulating film 2 may contain only the liquid crystal polymer. When the insulating film 2 contains an additive, the melting point of the insulating film 2 is preferably the same as the melting point of the liquid crystal polymer (the insulating film containing only the liquid crystal polymer).

Moreover, in the preparation step, each of the insulating film 2 and the metal foils 3 is once rolled up and is thus formed in the form of a roll. Then, the insulating film 2 in the form of a roll is installed in a delivery apparatus 5 which will be described later, and the metal foils 3 each in the form of a roll are installed in delivery apparatuses 6 which will be described later.

In the present embodiment, the preparation step is performed, and then, the molding step is performed.

Figure 5:
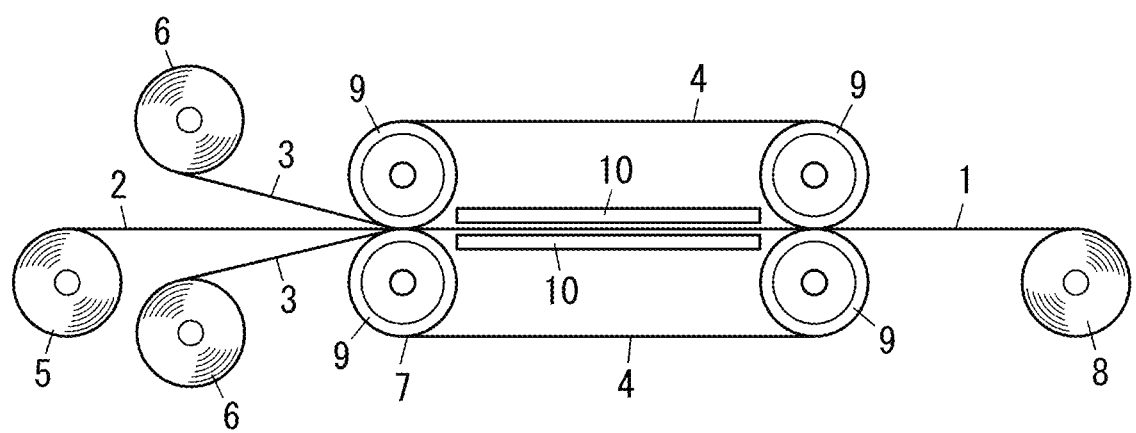
FIG. 5 is a view illustrating a method for manufacturing the metal clad laminated plate according to the embodiment.
Figure 6:
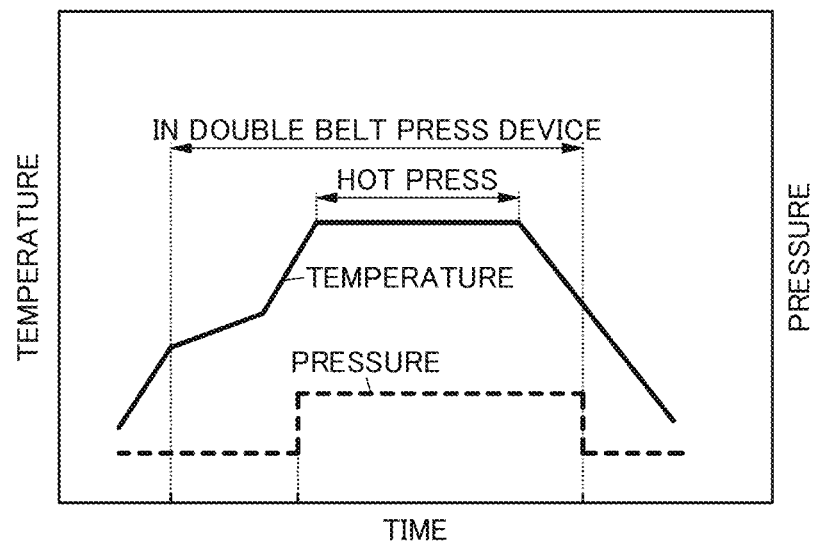
FIG. 6 is a view illustrating the method.

The molding step is a step of forming a metal clad laminated plate from a laminated body including the insulating film 2 and the metal foils 3 laid on the insulating film 2 and is performed by a metal clad laminated plate manufacturing device (hereinafter referred to as a manufacturing device) as illustrated in FIG. 5.

The manufacturing device includes the delivery apparatus 5 configured to deliver the insulating film 2, the delivery apparatuses 6 configured to deliver the metal foils 3, a winder 8 configured to roll up the metal clad laminated plate 1, and a double belt press device 7 disposed between the winder 8 and a set of the delivery apparatuses 5 and 6.

The double belt press device 7 includes a pair of endless belts 4, drums 9, and a pair of thermal pressure devices 10. The pair of endless belts 4 are vertically disposed with the laminated body being sandwiched therebetween. Of the pair of endless belts 4, one endless belt 4 encircles two drums 9, and the other endless belt 4 encircles two drums 9. The pair of thermal pressure devices 10 are disposed with the endless belts 4, 4 and the laminated body being sandwiched therebetween. The thermal pressure devices 10 hot-presses the laminated body via the endless belts 4. The thermal pressure devices 10 includes, for example, a hydraulic plate. The hydraulic plate is configured to hot-press the laminated body via the endless belts 4 by the hydraulic pressure of, for example, heated liquid.

The endless belt 4 is not specifically limited but is made of, for example, metal.

Moreover, the pair of drums 9 vertically facing each other rotate to deliver the laminated body toward the winder 8. Along with this rotation, the pair of endless belts 4 turn.

In the molding step, the delivery apparatus 5 holds the insulating film 2 in a rolled state and continuously feeds the insulating film 2 to the double belt press device 7. The delivery apparatuses 6 hold the metal foils 3 in a rolled state and continuously feed the metal foils 3 to the double belt press device 7. Thus, between the double belt press device 7 and the set of the delivery apparatuses 5 and 6, the laminated body including the insulating film 2 and the metal foils 3 laid on the insulating film 2 is formed, and the laminated body is hot-pressed by the double belt press method. The double belt press method is performed by the double belt press device 7.

The double belt press method adopted in the molding step applies uniform pressure to the entirety of a pressurizing surface of the laminated body via the pair of endless belts 4. This reduces variations in the pressure applied to the insulating film 2 and reduces the interior stress in the insulating layer 21 of the metal clad laminated plate 1 to be obtained after the molding step. Thus, the dimensional stability of the metal clad laminated plate 1 is improved and is easily stabilized.

When the laminated body is hot-pressed, for example, the laminated body is heated as the laminated body comes close to the double belt press device 7. Next, the laminated body is further heated while the laminated body passes the drums 9, the laminated body is hot-pressed via the endless belts 4 while the laminated body passes between the thermal pressure devices 10, and the laminated body is heated to the highest heating temperature. Then, the laminated body, which has been hot-pressed, passes the drums 9 and is cooled as the laminated body is away from the thermal pressure devices 10.

The highest heating temperature when the laminated body is hot-pressed via the endless belts 4 by the thermal pressure devices 10 is preferably higher than or equal to a temperature which is lower than the melting point of the insulating film 2 by 5° C. and lower than or equal to a temperature higher than the melting point of the insulating film 2 by 20° C. In this case, a reduced number of voids is formed between the insulating layer 21 and the metal foil 3 of the metal clad laminated plate 1 to be formed, so that high adhesive strength (pull strength) can be obtained between the insulating layer 21 and the metal foil 3. In addition, the metal clad laminated plate 1 can obtain a preferred plate thickness accuracy. The plate thickness accuracy enables the metal clad laminated plate 1 to easily obtain preferred high-frequency transmission characteristics. Moreover, the highest heating temperature is preferably maintained for longer than or equal to 20 seconds and shorter than or equal to 120 seconds. In this case, a reduced number of voids is formed between the insulating layer 21 and the metal foil 3 of the metal clad laminated plate 1 to be formed, so that high adhesiveness can be obtained between the insulating layer 21 and the metal foil 3. In addition, the metal clad laminated plate 1 can obtain a preferred plate thickness accuracy. The plate thickness accuracy enables the metal clad laminated plate 1 to easily obtain high-frequency transmission characteristics.

The laminated body is hot-pressed preferably at a pressure of greater than or equal to 2 MPa and less than or equal to 5 MPa. In this case, a reduced number of voids is formed between the insulating layer 21 and the metal foil 3 of the metal clad laminated plate 1 to be formed, so that high adhesiveness can be obtained between the insulating layer 21 and the metal foil 3. Moreover, the pressure may be less than 4.0 MPa or may be less than or equal to 3.5 MPa.

Furthermore, in the molding step, application of nonuniform pressure to the insulating film 2 impairs the plate thickness accuracy of the metal clad laminated plate 1 to be obtained, which tends to impair the high-frequency transmission characteristics. Thus, hot pressing by the double belt press device 7 enables uniform pressure to be applied to the insulating film 2. This enables the plate thickness accuracy of the metal clad laminated plate 1 to be improved and enables the metal clad laminated plate 1 to obtain preferred high-frequency transmission characteristics.

In the present embodiment, the metal clad laminated plate 1 continuously delivered from the double belt press device 7 is rolled up in the form of a roll by the winder 8.

The metal clad laminated plate 1 thus manufactured is applicable to manufacturing of the printed wiring board. For example, the metal foil 3 of the metal clad laminated plate 1 may be subjected to an arbitrary wiring process, thereby manufacturing the printed wiring board. To the printed wiring board, an insulating layer and a conductor wire may be added by an appropriate method to obtain a multilayered printed wiring board.

The material for the insulating layer may be the same material as that for the insulating layer 21 or may be different from that for the insulating layer 21.

The material for the metal layer may be the same as that for the metal foil 3 or may be different from that of the metal foil 3.

<Variation>

In the embodiment described above, the metal clad laminated plate 1 is a double-sided metal clad laminated plate. Alternatively, the metal clad laminated plate 1 may be a single-sided metal clad laminated plate. For manufacturing the single-sided metal clad laminated plate, one delivery apparatus 6 of the two delivery apparatuses 6 feeds a stripping sheet laid on the insulating film 2 to the double belt press device 7. The stripping sheet has at least releasability from the insulating layer 21 and may be any sheet material. The stripping sheet is made of, for example, a resin material such as a polyimide resin or a tetrafluoro ethylene resin which provides both the releasability and the heat resistance.

EXAMPLE

The present disclosure will be specifically described with reference to examples below.

Examples and Comparative Examples

Each of examples and comparative examples are embodied by using the following materials.
<Metal Foil 3>
Metal foil A: "TP4-S" (copper foil) manufactured by Fukuda Metal Foil & Powder Co., Ltd.
Metal foil B: "F2WS" (copper foil) manufactured by Furukawa Electric Co., Ltd.
Metal foil C: "3EC-VLP" (copper foil) manufactured by Mitsui Mining & Smelting Co., Ltd.
Metal foil D: "TQ-M7-VSP" (copper foil) manufactured by Mitsui Mining & Smelting Co., Ltd.
Metal foil E: "BHFX-P92C-HA-V2" (copper foil) manufactured by JX Nippon Mining & Metals Corporation
<Insulating Film 2>
Insulating film A: "Vecstar CT-Z" manufactured by Kuraray Co., Ltd.
Insulating film B: "Vecstar CT-Q" manufactured by Kuraray Co., Ltd.

First Example

An insulating film A was sandwiched between rough surfaces of two metal foils A with a metal clad laminated plate manufacturing device having the structure shown in FIG. 5, thereby producing a laminated body, and then, the laminated body was hot-pressed by a double belt press method, thereby manufacturing a metal clad laminated plate. The laminated body was hot-pressed at a pressure of 3.5 MPa, where the highest heating temperature was 335° C. and the highest heating temperature was maintained for 30 seconds.

Second Example

A metal clad laminated plate 1 was manufactured by a similar method to the first example except that metal foils B were used in place of the metal foils A.

Third Example

A metal clad laminated plate 1 was manufactured by a similar method to the first example except that an insulating film B was used in place of the insulating film A and the laminated body was hot-pressed under a pressure of 3.5 MPa with the highest heating temperature of 310° C. being maintained for 50 seconds.

Fourth Example

An insulating film B was sandwiched between rough surfaces of two metal foils C, thereby providing a laminated body. Then, the laminated body was hot-pressed by the double belt press method under the condition shown in Table 1, thereby manufacturing a double-sided metal clad laminated plate (a metal clad laminated plate 1).

Fifth Example

An insulating film B was sandwiched between rough surfaces of two metal foil D, thereby providing a laminated body. Then, the laminated body was hot-pressed by the double belt press method under the condition shown in Table 1, thereby manufacturing a double-sided metal clad laminated plate (a metal clad laminated plate 1).

Sixth Example

An insulating film B was sandwiched between rough surfaces of two metal foils E, thereby providing a laminated body. Then, the laminated body was hot-pressed by the double belt press method under the condition shown in Table 1, thereby manufacturing a double-sided metal clad laminated plate (a metal clad laminated plate 1).

First Comparative Example

An insulating film A was sandwiched between rough surfaces of two metal foil A, thereby providing a laminated body. Then, the laminated body was hot-pressed between two molding boards under the condition shown in Table 1 below, thereby manufacturing a double-sided metal clad laminated plate (a metal clad laminated plate 1).

Second Comparative Example

An insulating film B was sandwiched between rough surfaces of two metal foil B, thereby providing a laminated body. Then, the laminated body was hot-pressed between two molding boards under the condition shown in Table 1 below, thereby manufacturing a double-sided metal clad laminated plate (a metal clad laminated plate 1).

Third Comparative Example

An insulating film A was sandwiched between rough surfaces of two metal foil A, thereby providing a laminated body. Then, the laminated body was hot-pressed between two rolls under the condition shown in Table 1 below, thereby manufacturing a double-sided metal clad laminated plate (a metal clad laminated plate 1).

Fourth Comparative Example

An insulating film B was sandwiched between rough surfaces of two metal foil B, thereby providing a laminated body. Then, the laminated body was hot-pressed between two rolls under the condition shown in Table 1 below, thereby manufacturing a double-sided metal clad laminated plate (a metal clad laminated plate 1).

Fifth Comparative Example

An insulating film A was sandwiched between rough surfaces of two metal foils B, thereby providing a laminated body. Then, the laminated body was hot-pressed by the double belt press method under the condition shown in Table 1 below, thereby manufacturing a double-sided metal clad laminated plate (a metal clad laminated plate 1).

TABLE 1

| | | Example 1 | Example 2 | Example 3 | Example 4 | Example 5 | Example 6 |
|---|---|---|---|---|---|---|---|
| LCP | Material Type | Insulating Film A | Insulating Film A | Insulating Film B | Insulating Film B | Insulating Film B | Insulating Film B |
| | Thickness (μm) | 100 | 100 | 100 | 100 | 100 | 100 |
| | Melting Point (° C.) | 335 | 335 | 310 | 310 | 310 | 310 |
| Copper Foil | Material Type | Metal Foil A | Metal Foil B | Metal Foil A | Metal Foil C | Metal Foil D | Metal Foil E |
| | Thickness (μm) | 12 | 12 | 12 | 12 | 12 | 12 |
| | Rough Surface Ten-Point Average Roughness (Rzjis) (μm)*1 | 1.2 | 2.5 | 1.2 | 3.5 | 1.2 | 1.0 |
| | Mean Width of Profile Elements (RSm) (μm) *2 | 20 | 65 | 20 | 21 | 33 | 45 |
| Molding | Method | Double Belt Press | Double Belt Press | Double Belt Press | Double Belt Press | Double Belt Press | Double Belt Press |
| | Heating Temperature in Hot Press (° C.) | 335 | 335 | 310 | 310 | 310 | 310 |
| | Pressure in Hot Press (MPa) | 3.5 | 3.5 | 3.5 | 3.5 | 3.5 | 3.5 |
| | Time for Hot Press (Second) | 30 | 30 | 50 | 50 | 50 | 50 |
| Metal Clad Laminated Plate | Cross-Section The Average Number of Voids *3 | 0 | 0 | 0 | 0 | 0 | 0 |
| | Ten-Point Average Roughness (Rzjis) (μm)*4 | 1.2 | 2.5 | 1.2 | 3.5 | 1.2 | 1.0 |
| | Mean Width of Profile Elements (RSm)(μm) *5 | 20 | 65 | 20 | 21 | 33 | 45 |
| Evaluation Result | Pull Strength of Metal Foil from Insulating Layer | 0.8 | 1 | 0.8 | 1.3 | 1.2 | 0.8 |
| | Plate Thickness Accuracy | <±10% | <±10% | <±10% | <±10% | <±10% | <±10% |
| | Average Thickness of Metal Clad Laminated Plate (μm) | 124 | 124 | 124 | 124 | 124 | 124 |
| | Dimensional Stability | <±0.1% | <±0.1% | <±0.1% | <±0.1% | <±0.1% | <±0.1% |
| | High-Frequency Transmission Characteristics (dB/100 mm) | −3.4 | −5.5 | −3.4 | −6.1 | −3.6 | −3.4 |

| | | Comparative Example 1 | Comparative Example 2 | Comparative Example 3 | Comparative Example 4 | Comparative Example 5 |
|---|---|---|---|---|---|---|
| LCP | Material Type | Insulating Film A | Insulating Film B | Insulating Film A | Insulating Film B | Insulating Film A |
| | Thickness (μm) | 100 | 100 | 100 | 100 | 100 |
| | Melting Point (° C.) | 335 | 310 | 335 | 310 | 335 |

TABLE 1-continued

| Copper Foil | Material Type | | Metal Foil A | Metal Foil B | Metal Foil A | Metal Foil B | Metal Foil B |
|---|---|---|---|---|---|---|---|
| | Thickness (μm) | | 12 | 12 | 12 | 12 | 12 |
| | Rough Surface | Ten-Point Average Roughness (Rzjis) (μm)*1 | 1.2 | 2.5 | 1.2 | 2.5 | 2.5 |
| | | Mean Width of Profile Elements (RSm) (μm) *2 | 20 | 65 | 20 | 65 | 65 |
| Molding | Method | | Hot Plate Press | Hot Plate Press | Roll Press | Roll Press | Double Belt Press |
| | Heating Temperature in Hot Press (° C.) | | 330 | 305 | 340 | 315 | 335 |
| | Pressure in Hot Press (MPa) | | 3.5 | 3.5 | 4 | 4 | 4 |
| | Time for Hot Press (Second) | | 5400 | 5400 | 10 | 10 | 10 |
| Metal Clad Laminated Plate | Cross-Section | The Average Number of Voids *3 | 0 | 0 | 5 | 11 | 5 |
| | | Ten-Point Average Roughness (Rzjis) (μm)*4 | 1.2 | 2.5 | 1.2 | 2.5 | 2.5 |
| | | Mean Width of Profile Elements (RSm)(μm) *5 | 20 | 65 | 20 | 65 | 65 |
| Evaluation Result | Pull Strength of Metal Foil from Insulating Layer | | 0.8 | 1 | 0.5 | 0.7 | 0.5 |
| | Plate Thickness Accuracy | | ±20% | ±20% | ±10% | ±10% | ±10% |
| | Average Thickness of Metal Clad Laminated Plate (μm) | | 120 | 120 | 124 | 124 | 124 |
| | Dimensional Stability | | <±0.2% | <±0.2% | <±0.2% | <±0.2% | <±0.1% |
| | High-Frequency Transmission Characteristics (dB/100 mm) | | −3.4 | −5.5 | −3.4 | −5.5 | −5.5 |

*1-*2: Value per 10 μm of travel distance of contact-type surface roughness meter to rough surface of metal foil.
*3-*5: Value per 10 μm in length in direction orthogonal to direction in which metal foil and insulating layer face each other in cross-section of metal clad laminated plate.

<Evaluation>

[Pull Strength]

m the metal clad laminated plate 1 of each of the examples and the comparative examples, a test piece (width× length=10 mm×150 mm) was produced. Based on the test piece, the pull strength of the metal foil 3 from the insulating layer 21 was measured in accordance with JIS C 6481.

[Plate Thickness Accuracy]

The plate thickness accuracy of the metal clad laminated plate 1 of each of the examples and the comparative examples was calculated by the following procedure. First, thicknesses of the metal clad laminated plate 1 were measured at arbitrary ten pints of the metal clad laminated plate 1. Then, an average value of the thicknesses at the ten points was calculated, thereby obtaining the average thickness of the metal clad laminated plate 1. In addition, a maximum value and a minimum value of the thicknesses at the ten points were respectively defined as a maximum thickness and a minimum thickness. Next, the difference (d1) between the maximum thickness and the average thickness and the difference (d2) between the minimum thickness and the average thickness were calculated. Then, a value as the ratio of the difference (d1) to the average thickness and a value as the ratio of the difference (d2) to the average thickness were calculated, thereby obtaining the plate thickness accuracy of the metal clad laminated plate 1.

[Dimension Change (Dimensional Stability)]

The dimensional stability of the metal clad laminated plate 1 of each of the examples and the comparative examples was calculated in accordance with IPC-TM650 No.2.2.4 Method C.

[Photograph of Cross Section]

The cross section of the metal clad laminated plate 1 of the second example was photographed with a scanning electron microscope, thereby obtaining the photograph shown in FIG. 2. In addition, the cross section of the metal clad laminated plate 1 of the second comparative example was photographed with the scanning electron microscope, thereby obtaining the photograph shown in FIG. 4. The cross section shown in each of FIGS. 2 and 4 has a length b of 10 μm in a direction orthogonal to a direction in which the metal foil 3 and the insulating layer 21 face each other. In the photograph shown in FIG. 2, no void was observed between the insulating layer 21 and the metal foil 3. In the photograph shown in FIG. 4, ten voids 23 were observed between the insulating layer 21 and the metal foil 3. In this way, the number of voids formed at the ten points in the cross section of the metal clad laminated plate 1 of each of the examples and the comparative examples was counted. Then, the total number of voids in each of the examples and the comparative examples was divided by the number of cross sections (ten points), thereby obtaining the average number of voids formed in each metal clad laminated plate 1.

[High-Frequency Transmission Characteristics]

First, plating layers each having a thickness of 10 μm were further formed on both surfaces of the metal clad laminated plate 1 of each of the examples and the comparative examples, thereby forming metal layers each including the metal foil 3 and the plating layer on respective surfaces of the metal clad laminated plate 1. Next, one metal layer of the metal layers was subjected to an etching process, thereby forming a signal circuit (a micro strip line), and the other metal layer was defined as a ground circuit. Thus, a test piece including the signal circuit and the ground circuit was prepared. Then, the signal circuit was caused to transmit a high-frequency electric signal, and the transmission loss of the electric signal in the signal circuit was measured at 25° C. and at 40% RH by a probe method with E5071C manufactured by Agilent Technologies Japan, Ltd. Next, the transmission loss per 100 mm of the wire length of the signal circuit was calculated as high-frequency transmission characteristics. Table 1 shows the high-frequency transmission characteristics in the case where the frequency of the electric signal input to the signal circuit is 20 GHz.

<Measurement>

[Metal Foil]

[Ten-Point Average Roughness (Rzjis) of Rough Surface]

The ten-point average roughness (Rzjis), defined in JIS B 0601:2001, of the contact surface of the metal foil 3 was measured before the metal clad laminated plate 1 was manufactured.

[Mean Width of Profile Elements (RSm)]

The mean width of profile elements (RSm), defined in JIS B 0601:2001, of the contact surface of the metal foil 3 was measured before the metal clad laminated plate 1 was manufactured.

[Metal Clad Laminated Plate]

[Ten-Point Average Roughness (Rzjis) Calculated from Roughness Curve Obtained from Cross Section of Metal Clad Laminated Plate]

From the photograph of the cross section of each of the examples and the comparative examples, the roughness curve c as illustrated in FIG. 3 was created. Then, in accordance with JIS B 0601:2001, the ten-point average roughness (Rzjis) was calculated based on the roughness curve c of each of the examples and the comparative examples.

[Mean Width of Profile Elements (RSm)]

In accordance with JIS B 0601:2001, the mean width of profile elements (RSm) was calculated based on the roughness curve of each of the examples and the comparative examples.

REFERENCE SIGNS LIST

1 METAL CLAD LAMINATED PLATE
21 INSULATING LAYER
3 METAL FOIL

What is claimed is:

1. A method for manufacturing a metal clad laminated plate, the metal clad laminated plate comprising:
   an insulating layer containing a liquid crystal polymer; and
   a metal foil lying on the insulating layer,
   the metal foil being a copper foil,
   the metal foil having a surface lying on the insulating layer, the surface having a mean width of profile elements (RSm) of greater than or equal to 10 μm and less than or equal to 45 μm, the mean width being calculated from a roughness curve obtained from a cross section of the metal clad laminated plate,
   the metal clad laminated plate having a plate thickness accuracy of less than ±20%,
   a pull strength of the metal foil from the insulating layer being greater than or equal to 0.8 N/mm,
   the method comprising:
   hot pressing a laminated body by a double belt press method, the laminated body including an insulating film containing the liquid crystal polymer and the metal foil lying on the insulating film,
   in the hot pressing of the laminated body, a highest heating temperature being higher than or equal to a temperature lower than a melting point of the insulating film by 5° C. and being lower than or equal to a temperature higher than the melting point by 20° C., and the highest heating temperature being maintained for longer than or equal to 20 seconds and shorter than or equal to 50 seconds.

2. The method of claim 1, further comprising:
providing a ten-point average roughness (Rzjis), calculated from the roughness curve, to be greater than or equal to 0.5 μm and less than or equal to 3 μm.

3. The method of claim 1, further comprising:
providing a number of voids which appear between the metal foil and the insulating layer in the cross section to be three or less per 10 μm in length in a direction orthogonal to a direction in which the metal foil and the insulating layer face each other.

4. The method of claim 1, further comprising:
providing a plate thickness accuracy of the metal clad laminated plate to be less than or equal to ±10%.

5. The method of claim 1, further comprising:
providing a dimensional stability, defined in IPC-TM650 No. 2.2.4, of the metal clad laminated plate to be less than or equal to ±0.1%.

6. The method of claim 1, further comprising:
providing the liquid crystal polymer with a melting point of higher than or equal to 300° C. and lower than or equal to 345° C.

7. The method of claim 2, further comprising:
providing a number of voids which appear between the metal foil and the insulating layer in the cross section to be three or less per 10 μm in length in a direction orthogonal to a direction in which the metal foil and the insulating layer face each other.

8. The method of claim 2, further comprising:
providing a plate thickness accuracy of the metal clad laminated plate to be less than or equal to ±10%.

9. The method of claim 2, further comprising:
providing a dimensional stability, defined in IPC-TM650 No. 2.2.4, of the metal clad laminated plate to be less than or equal to ±0.1%.

10. The method of claim 2, further comprising:
providing the liquid crystal polymer with a melting point of higher than or equal to 300° C. and lower than or equal to 345° C.

11. The method of claim 3, further comprising:
providing a plate thickness accuracy of the metal clad laminated plate to be less than or equal to ±10%.

12. The method of claim 3, further comprising:
providing a dimensional stability, defined in IPC-TM650 No. 2.2.4, of the metal clad laminated plate to be less than or equal to ±0.1%.

13. The method of claim 3, further comprising:
providing the liquid crystal polymer with a melting point of higher than or equal to 300° C. and lower than or equal to 345° C.

14. The method of claim 4, further comprising:
providing a dimensional stability, defined in IPC-TM650 No. 2.2.4, of the metal clad laminated plate to be less than or equal to ±0.1%.

15. The method of claim 4, further comprising:
providing the liquid crystal polymer with a melting point of higher than or equal to 300° C. and lower than or equal to 345°° C.

16. The method of claim 5, further comprising:
providing the liquid crystal polymer with a melting point of higher than or equal to 300° C. and lower than or equal to 345° C.

* * * * *